United States Patent
DeOrnellas et al.

(10) Patent No.: US 6,190,496 B1
(45) Date of Patent: *Feb. 20, 2001

(54) PLASMA ETCH REACTOR AND METHOD FOR EMERGING FILMS

(75) Inventors: Stephen P. DeOrnellas, Santa Rosa; Alferd Cofer, Petaluma; Robert C. Vail, Windsor, all of CA (US)

(73) Assignee: Tegal Corporation, Petaluma, CA (US)

( * ) Notice: Under 35 U.S.C. 154(b), the term of this patent shall be extended for 0 days.

This patent is subject to a terminal disclaimer.

(21) Appl. No.: 09/384,614

(22) Filed: Aug. 27, 1999

Related U.S. Application Data

(62) Division of application No. 08/675,093, filed on Jul. 3, 1996, now Pat. No. 6,048,435.

(51) Int. Cl.[7] .............................. H01L 21/00; H05H 1/00
(52) U.S. Cl. ........................................ 156/345; 118/723 E
(58) Field of Search ......................... 156/345; 118/923 E

(56) References Cited

U.S. PATENT DOCUMENTS

| | | |
|---|---|---|
| 2,468,174 | 4/1949 | Cotton . |
| 3,458,817 | 7/1969 | Cooper et al. . |
| 4,167,370 | 9/1979 | Graneau et al. . |
| 4,230,515 | 10/1980 | Zajac . |
| 4,233,109 | 11/1980 | Nishizawa . |
| 4,243,476 | 1/1981 | Ahn et al. . |
| 4,263,088 | 4/1981 | Gorin . |
| 4,340,461 | 7/1982 | Hendricks et al. . |
| 4,349,409 | 9/1982 | Shibayama et al. . |
| 4,352,725 | 10/1982 | Tsukada . |
| 4,399,016 | 8/1983 | Tsukada et al. . |
| 4,464,223 | 8/1984 | Gorin . |
| 4,579,618 | 4/1986 | Celestino et al. . |
| 4,585,516 | 4/1986 | Corn et al. . |
| 4,612,077 | 9/1986 | Tracy et al. . |
| 4,617,079 | 10/1986 | Tracy et al. . |
| 4,889,588 | 12/1989 | Fior . |
| 4,902,377 | 2/1990 | Berglund et al. . |
| 4,963,242 | 10/1990 | Sato et al. . |
| 4,996,077 | 2/1991 | Moslehi et al. . |

(List continued on next page.)

FOREIGN PATENT DOCUMENTS

| | | |
|---|---|---|
| 1 089 112 | 1/1959 | (DE) . |
| 0026604A1 | 8/1981 | (EP) . |
| 284436 | 9/1988 | (EP) . |
| 0 552 491 A1 | 7/1993 | (EP) . |
| 52-127168 | 10/1977 | (JP) . |
| 58-122731 | 7/1983 | (JP) . |
| 59016334 | 1/1984 | (JP) . |
| 61-116841 | 6/1986 | (JP) . |
| 3-002377 | 1/1991 | (JP) . |
| 3-241740 | 10/1991 | (JP) . |
| 3-254047 | 11/1991 | (JP) . |
| 7-245296 | 9/1995 | (JP) . |
| 329101 | 9/1991 | (WO) . |

OTHER PUBLICATIONS

V.J. Minkiewicz and B.N. Chapman, Triode plasma etching, Appl.Phys. Lett.34(3); Feb. 1979, pp.192–193.

(List continued on next page.)

Primary Examiner—Thi Dang
(74) Attorney, Agent, or Firm—Fliesler, Dubb, Meyer & Lovejoy

(57) ABSTRACT

A plasma etch reactor 20 includes a reactor chamber 22 with a grounded upper electrode 24, a lower electrode 28 which is attached to a high frequency power supply 30 and a low frequency power supply 32, and a peripheral electrode 26 which is located between the upper and lower electrode, and which is allowed to have a floating potential. Rare earth magnets 46, 47 are used to establish the magnetic field which confines the plasma developed within the reactor chamber 22. The plasma etch reactor 20 is capable of etching emerging films used with high density semiconductor devices.

48 Claims, 10 Drawing Sheets

U.S. PATENT DOCUMENTS

| | | |
|---|---|---|
| 5,032,205 | 7/1991 | Hershkowitz et al. . |
| 5,158,644 | 10/1992 | Cheung . |
| 5,192,849 | 3/1993 | Moslehi . |
| 5,252,178 | 10/1993 | Moslehi . |
| 5,308,417 | 5/1994 | Groechel et al. . |
| 5,401,351 | 3/1995 | Samukawa . |
| 5,492,855 | 2/1996 | Matsumoto et al. . |
| 5,498,768 | 3/1996 | Nishitani et al. . |
| 5,565,036 | 10/1996 | Westendorp et al. . |

OTHER PUBLICATIONS

B.N. Chapman, Triode Systems for Plasma Etching, IBN Technical Disclosure Bulletin, vol. 21, No. 12, May 1979, IBM Corp. 1979; pp. 5006–5007.

Y. Nishioka, et al., Giga–bit scale dram cell with new simple Ru/(Ba,Sr)Ti)$_3$/Ru stacked Capacitors using x–ray lithography, IEDM Tech. Digest, pp. 903–906, 1995.

A. Yuuki, et al., Novel stacked capacitor technology for 1 Gbit drams with CVD–(Ba,Sr)Ti)$_3$ thin films on a thick storage node of Ru, IEDM Tech. Digest, pp. 115–118, 1995.

W.J. Yoo, et al., Control of the pattern slope in $_{Ar/Cl_2}$/0$_2$ plasmas during etching of Pt, 1995 Dry Process Symposium, The Institute of Electrical Engineers of Japan, pp. 191–194 (1995).

Engemann, J., et al., Large volume electron cyclotron resonance plasma generation by use of the slotted antenna microwave source, J.Vac.Sci.Technol.A 13(3), May/Jun. 1995, pp. 875–882.

B.N. Chapman, Triode Systems for Plasma Etching, IBM Technical Disclosure Bulletin, vol. 21, No. 12, May 1979, pp. 5006–5007.

Alan R. Reinberg, Plasma Etch Equipment Technology, M. Triodes, Perkin–Elmer Corporation, Norwalk, Connecticut, © 1989 by Academic Press, Inc, ISBN 0–12–469370–9; pp. 350–351.

World Patent Index, issued Sep. 10, 1991, "Forming etchant in reactive ion etching processes . . . compressed gas", Abstract No. 91/301255/41.

PCT/Notification of Transmittal of the International Search Report or the Declaration for International Application No. PCT/US97/01020, Date of Mailing—Jan. 23, 1997.

Plasma Etching Technology, Feb. 10–11, 1997, Burlingame, California, Continuing Education in Engineering, Unviersity Extension, U. of California, Berkeley, Plasma Etching Technology An Overview, D.L. Flamm, D.L. Flamm 1992–1996, title 95011501v2, D.L. Flamm 1995, src5012608, 3 pgs.

PCT/Notification of Transmittal of the International Search Report or the Declaration for International Application No. PCT/US97/00917, Date of Mailing—Jul. 21, 1997.

Brochure: The First Low–Pressure High Density Single–Wafer Etch Technology Has a New Name . . . HRe, High Density Reflected Electron, Tegal Corporation, 1993.

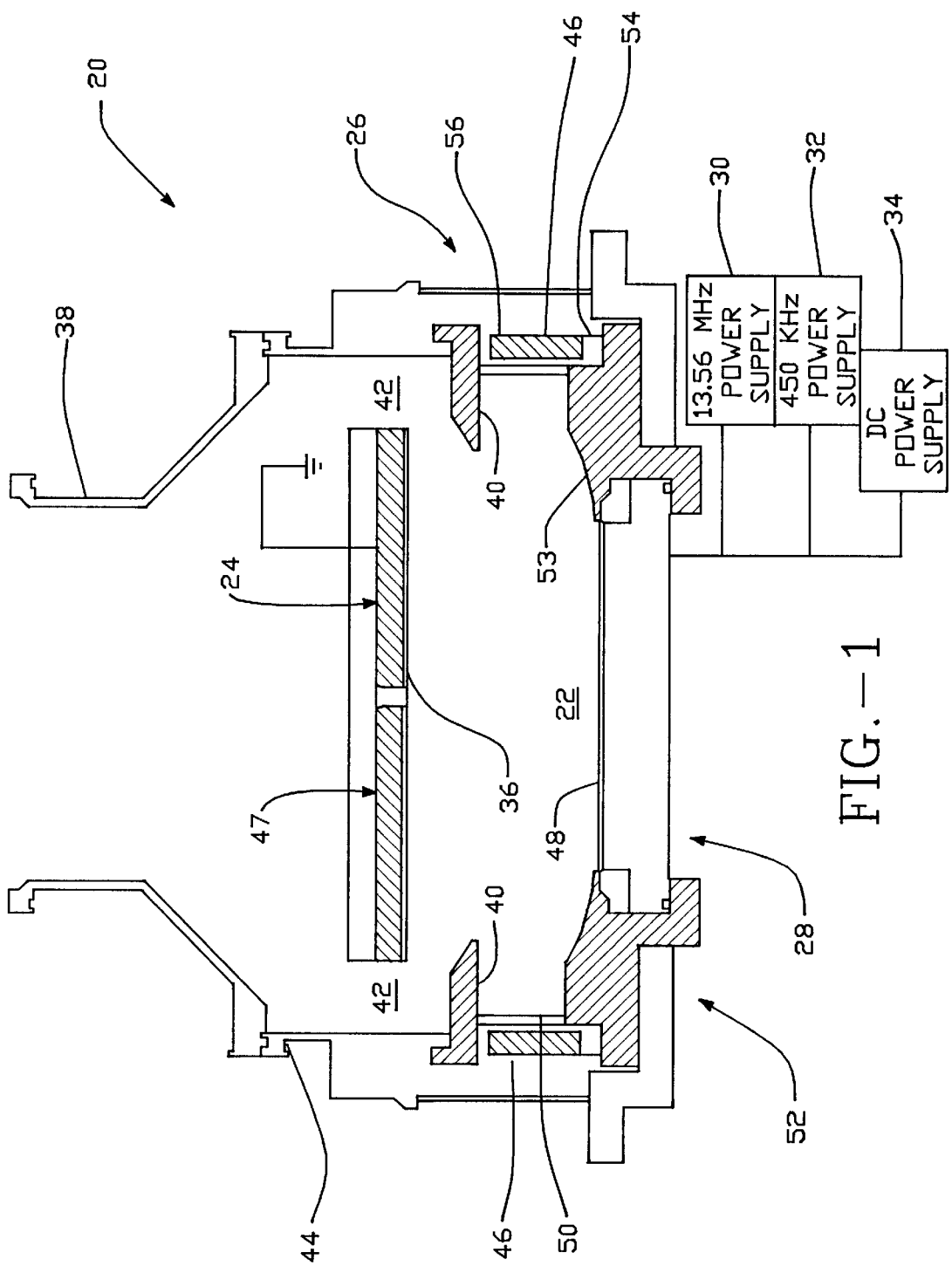
FIG.—1

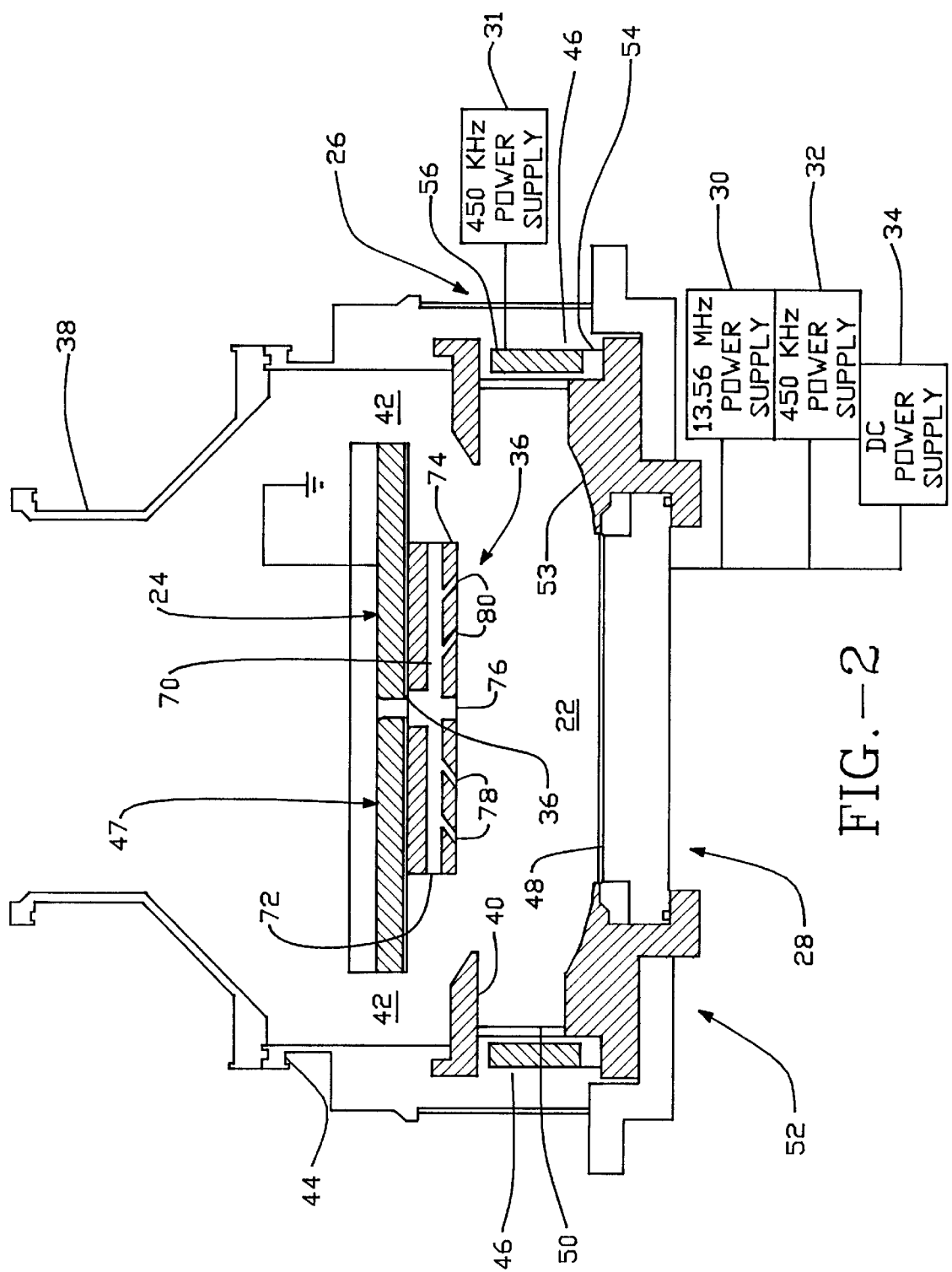

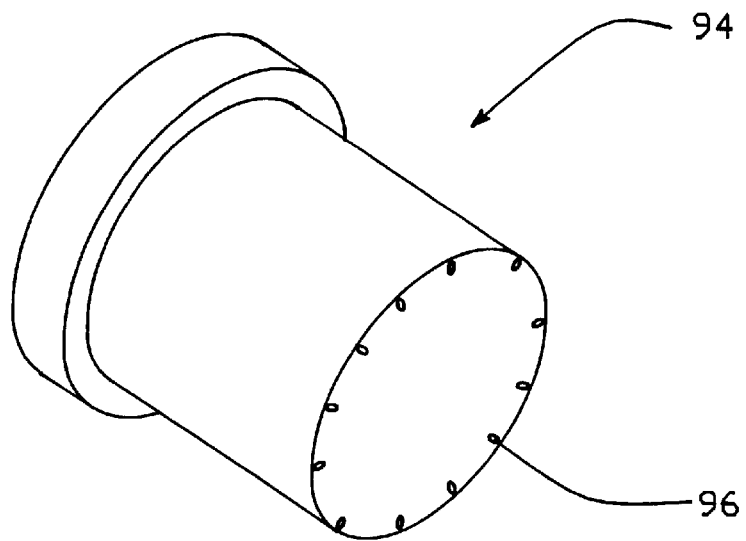
FIG.—4a
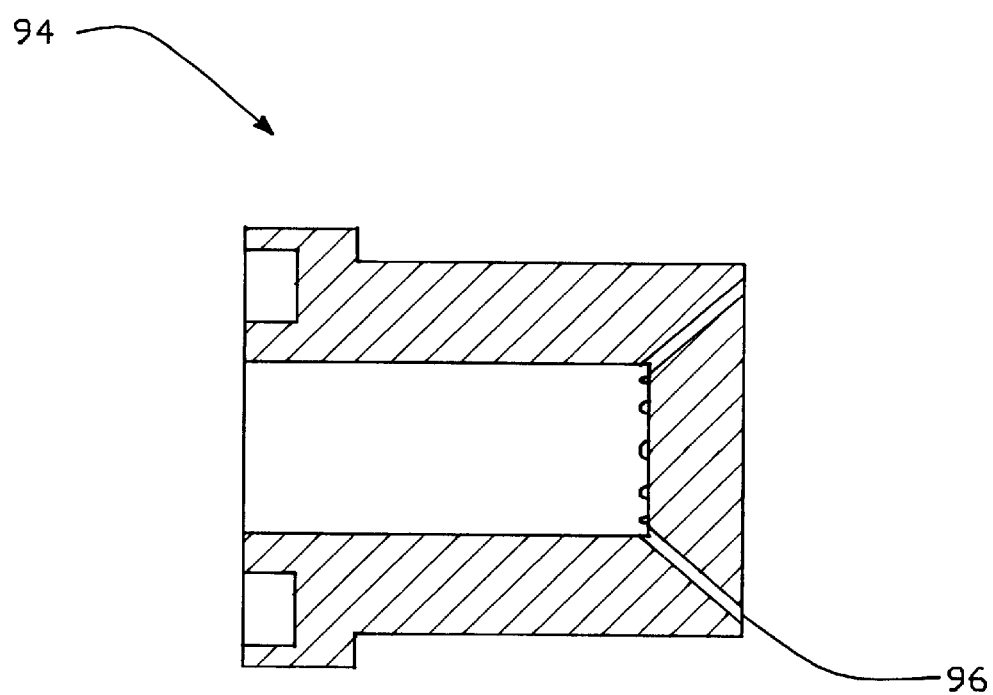
FIG.—4b

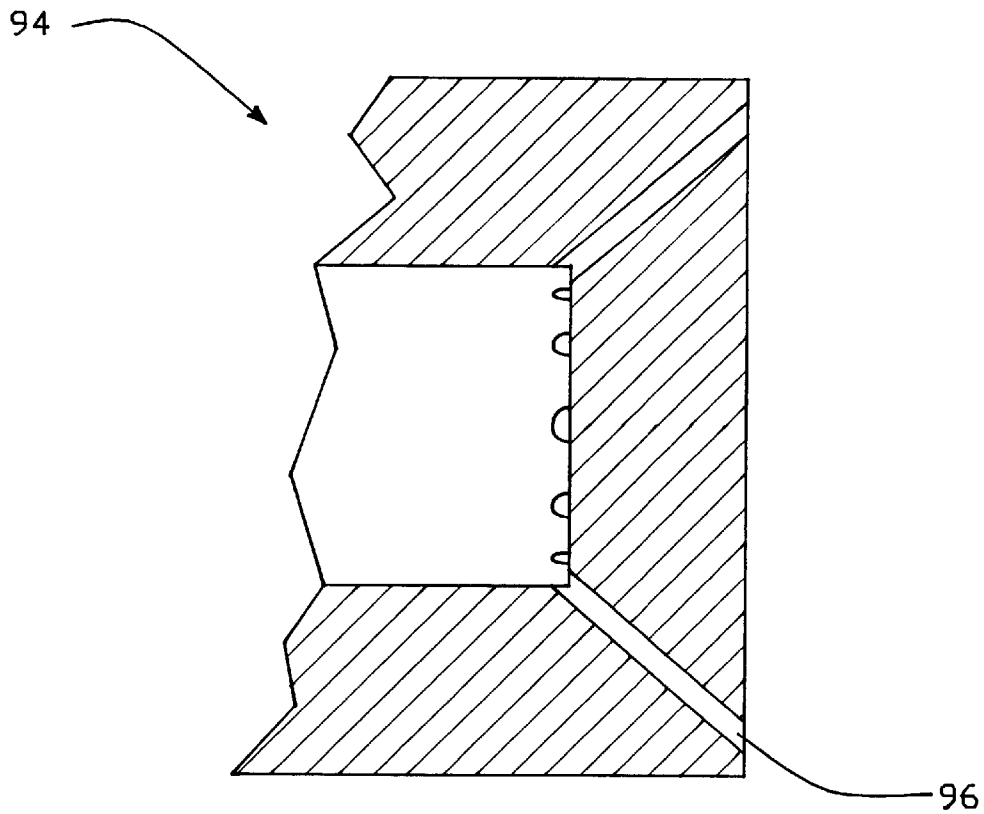
FIG.—4c
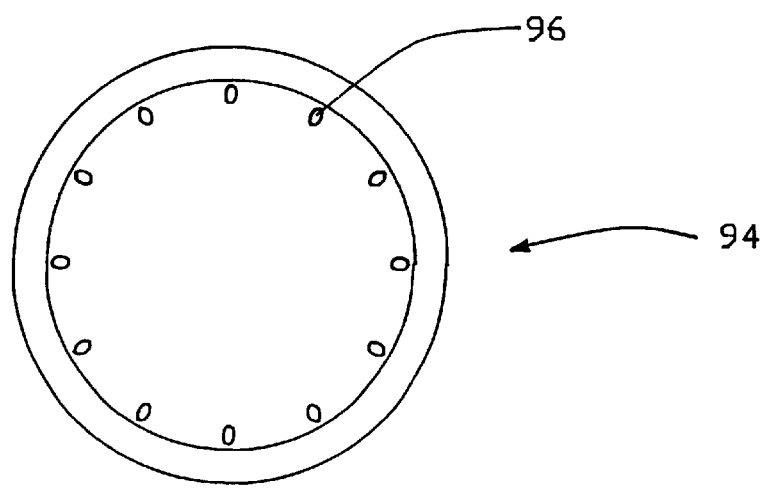
FIG.—4d

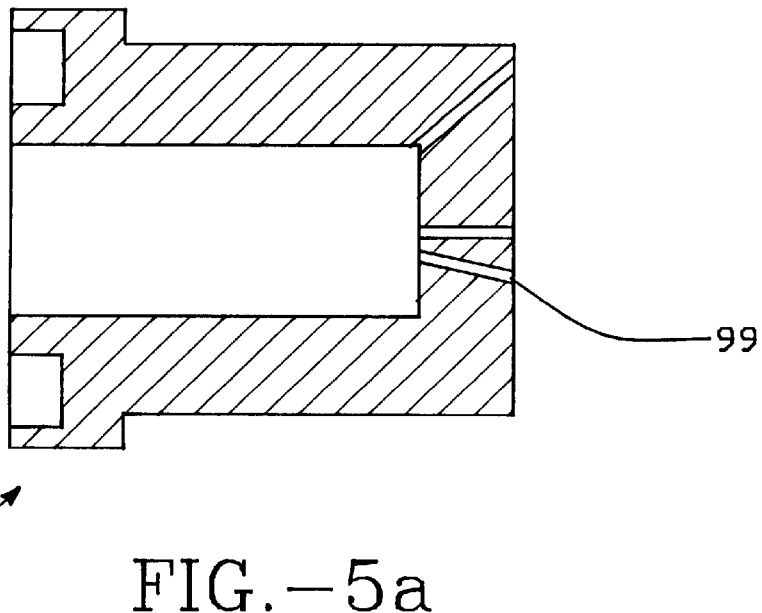
FIG.—5a
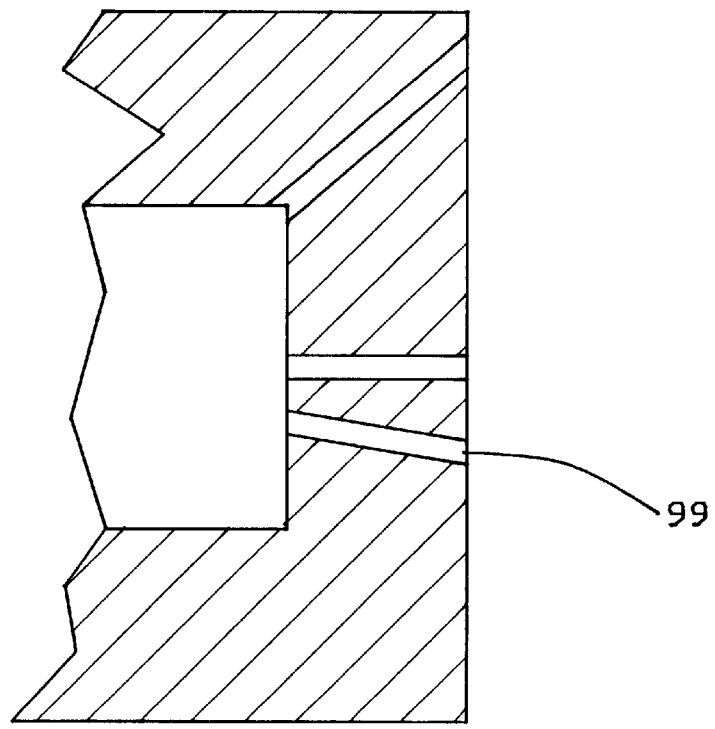
FIG.—5b

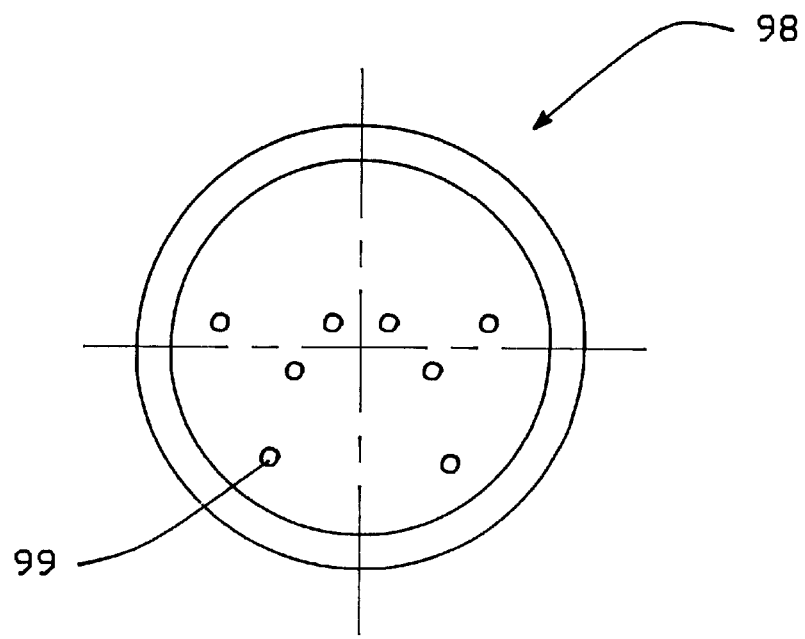
FIG.—5c
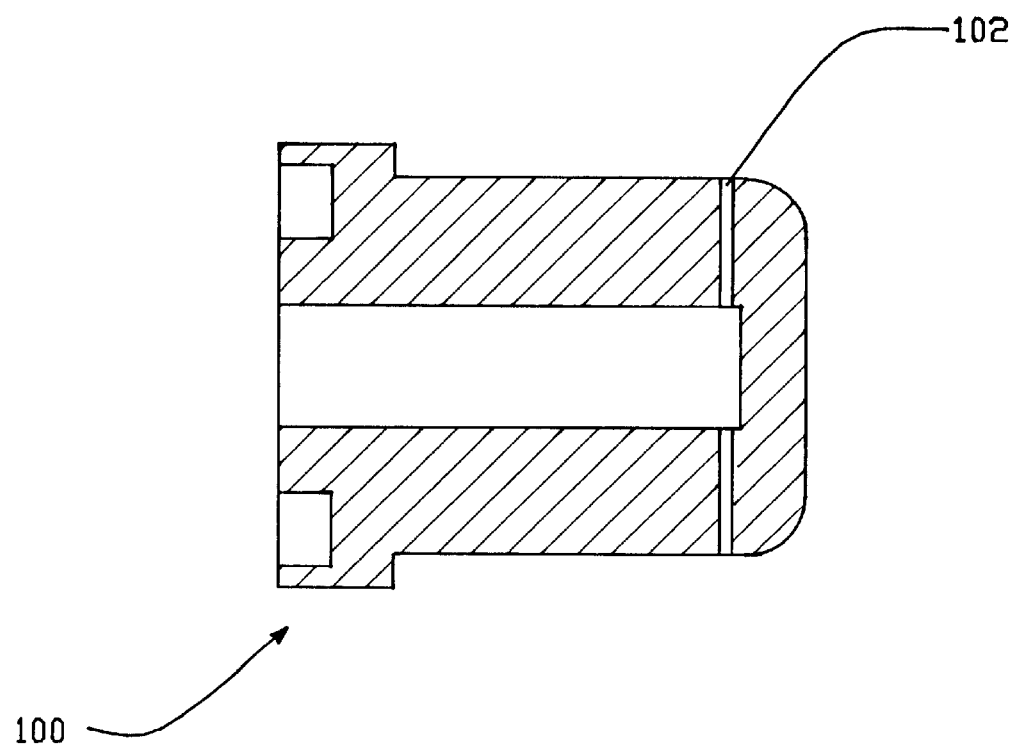
FIG.—6a

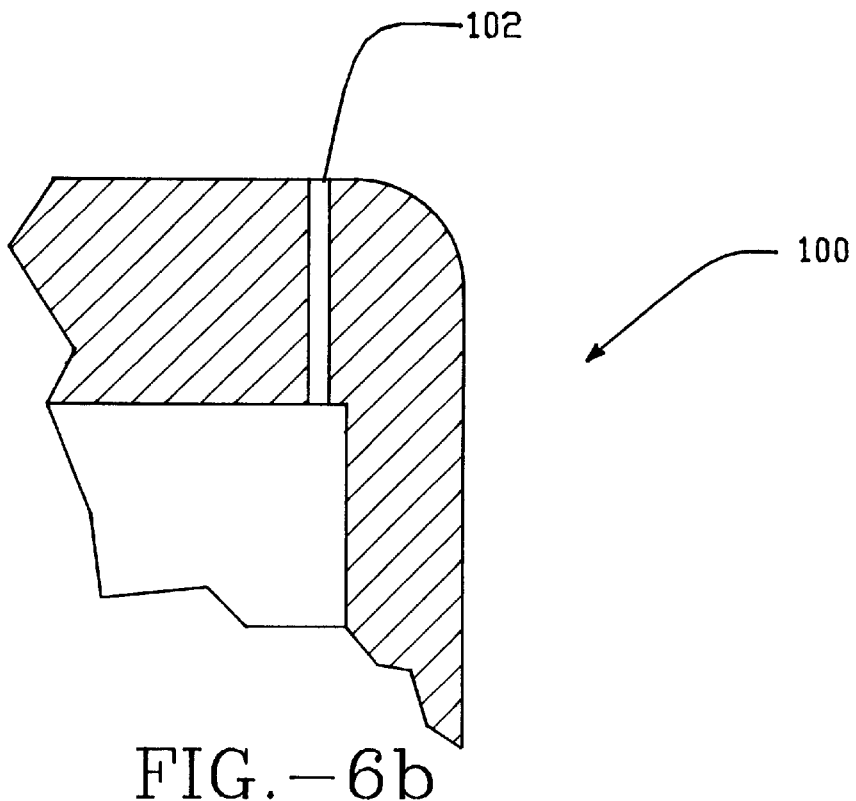
FIG.—6b
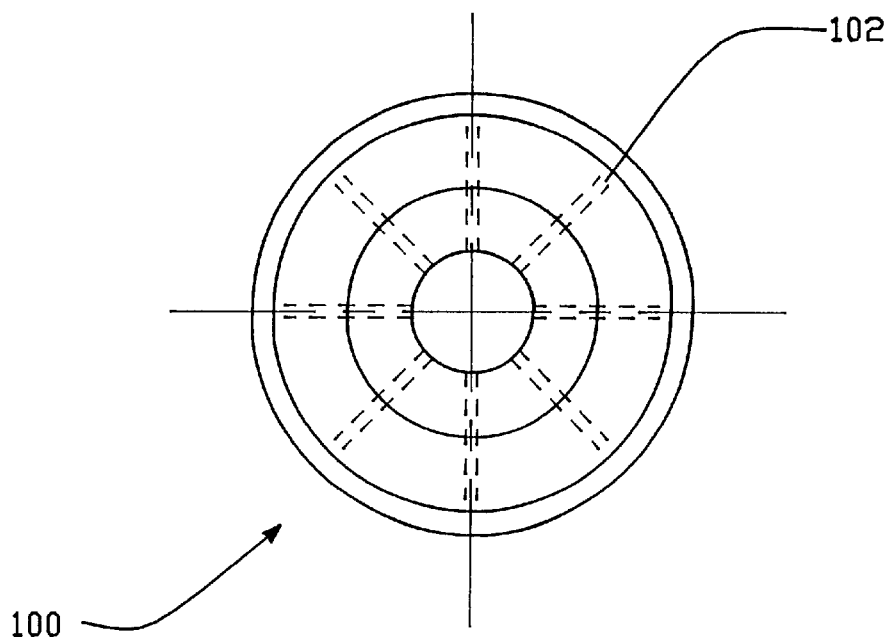
FIG.—6c

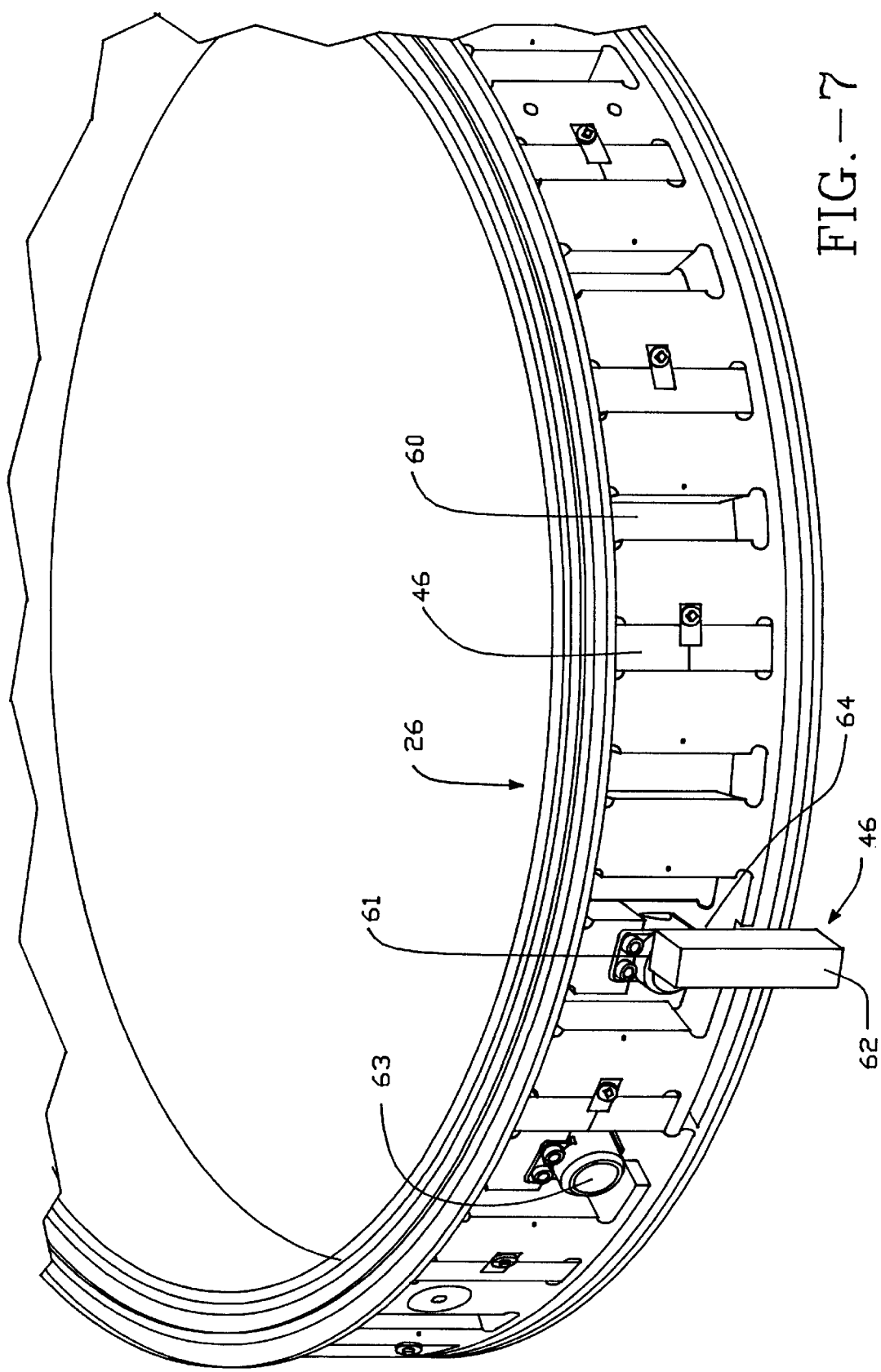
FIG.—7

PLASMA ETCH REACTOR AND METHOD FOR EMERGING FILMS

This application is a divisional of Ser. No. 08/675,093, filed Jul. 3, 1996, now U.S. Pat. No. 6,048,435.

CROSS-REFERENCE

The following U.S. patent applications, all owned by Tegal Corporation, are cross-referenced and hereby incorporated by reference:
1. Title: PLASMA ETCH REACTOR AND METHOD
   Inventors: Stephen P. DeOrnellas, Leslie G. Jerde Alfred Cofer, Robert C. Vail, Kurt A. Olson
   Ser. No.: 08/675,559
   Filed: Jul. 3, 1996
2. Title: PLASMA ETCH REACTOR HAVING A PLURALITY OF MAGNETS
   Inventors: Stephen P. DeOrnellas, Leslie G. Jerde Alfred Cofer, Robert C. Vail, Kurt A. Olson
   Ser. No.: 09/152,238
   Filed: Sep. 11, 1998
3. Title: PLASMA ETCH REACTOR AND METHOD FOR EMERGING FILMS
   Inventors: Stephen P. DeOrnellas, Alferd Cofer, Robert C. Vail
   Ser. No.: 08/675,093
   Filed: Jul. 3, 1996
4. Title: PLASMA ETCH REACTOR AND METHOD FOR EMERGING FILMS
   Inventors: Stephen P. DeOrnellas, Alferd Cofer, Robert C. Vail
   Ser. No.: Unknown
   Filed: Aug. 27, 1999
   Docket No.: TEGL 1009-DIV-1 SRM
5. Title: IMPROVED METHOD AND APPARATUS FOR ETCHING A SEMICONDUCTOR WAFER WITH FEATURES HAVING VERTICAL SIDEWALLS
   Inventors: Stephen P. DeOrnellas, Alferd Cofer, Robert C. Vail
   Ser. No.: 08/742,861
   Filed: Nov. 1, 1996

FIELD OF THE INVENTION

The present invention relates to an improved plasma etch reactor apparatus and method.

BACKGROUND OF THE INVENTION

A new set of emerging films are being beneficially employed in the development of high density semiconductor chips such as for example high density DRAM. These materials provide for higher capacity devices by allowing a reduction in the size of the individual features on the memory device. Accordingly, enhanced selectivity and profile control are required.

In the past, ion mills, which are a slow physical process, have been used to establish desired profiles on semiconductor wafers. Such ion mills have disadvantages in that the profile formed on the semiconductor wafer is sensitive to the angle of the ion mill beam and thus, the ion mill beam has to be accurately positioned to obtain the required profile. When profiles are obtained, however, large veils or ribs sticking up from the edges of the desired profiles have been experienced. Accordingly, ion mills are not well suited to emerging films.

Plasma etch processes for use in emerging films are faster, however such processes can in some cases provide unacceptable feature profiles. Accordingly, there is a need to provide an etching process which quickly and accurately process the emerging films that are used in the latest semiconductor products.

SUMMARY OF THE INVENTION

The present invention is directed toward a plasma etch reactor which can successfully process emerging films used in high density semiconductor devices.

The present invention provides for a plasma etch reactor which has a reactor chamber and an upper electrode which is grounded, a lower electrode which is connected to high frequency power supply, and a low frequency power supply, and a peripheral or ring electrode which is positioned between the upper and lower electrodes. The potential for said peripheral or ring electrode is allowed to float. Alternatively, the ring electrode can be grounded. Such a reactor can successfully process the newest emerging films used in high density semiconductor products.

It is a further object of the present invention to provide the reactor chamber with magnets in order to produce a high magnetic field, and thus a sufficiently dense plasma in order to successfully etch the newest emerging films.

It is a further object of the present invention to have the density and etch characteristics of the plasma controlled by one or more of the power sources.

Other objects and advantages of the invention will be obtained from a review of the descriptions, claims and figures.

BRIEF DESCRIPTION OF THE FIGS.

FIG. 1 is a side cross-sectional view of an embodiment of the plasma etch reactor of the invention.

FIG. 2 is a view similar to FIG. 1 with the addition of an enhanced process gas inlet nozzle.

FIGS. 4a, 4b, 4c, and 4d depict isometric, side cross-sectional, enlarged partial side cross-sectional, and end views of another preferred embodiment of a nozzle of the invention.

FIGS. 5a, 5b, and 5c depict side cross-sectional, enlarged partial cross-sectional, and end views of yet another preferred embodiment of a nozzle of the invention.

FIGS. 6a, 6b, and 6c depict side cross-sectional, enlarged partial cross-sectional, and end views of still a further embodiment of a nozzle of the invention.

FIG. 7 depicts a perspective view of the arrangement of the magnets associated with a peripheral electrode of an embodiment of the invention.

Figure 8:
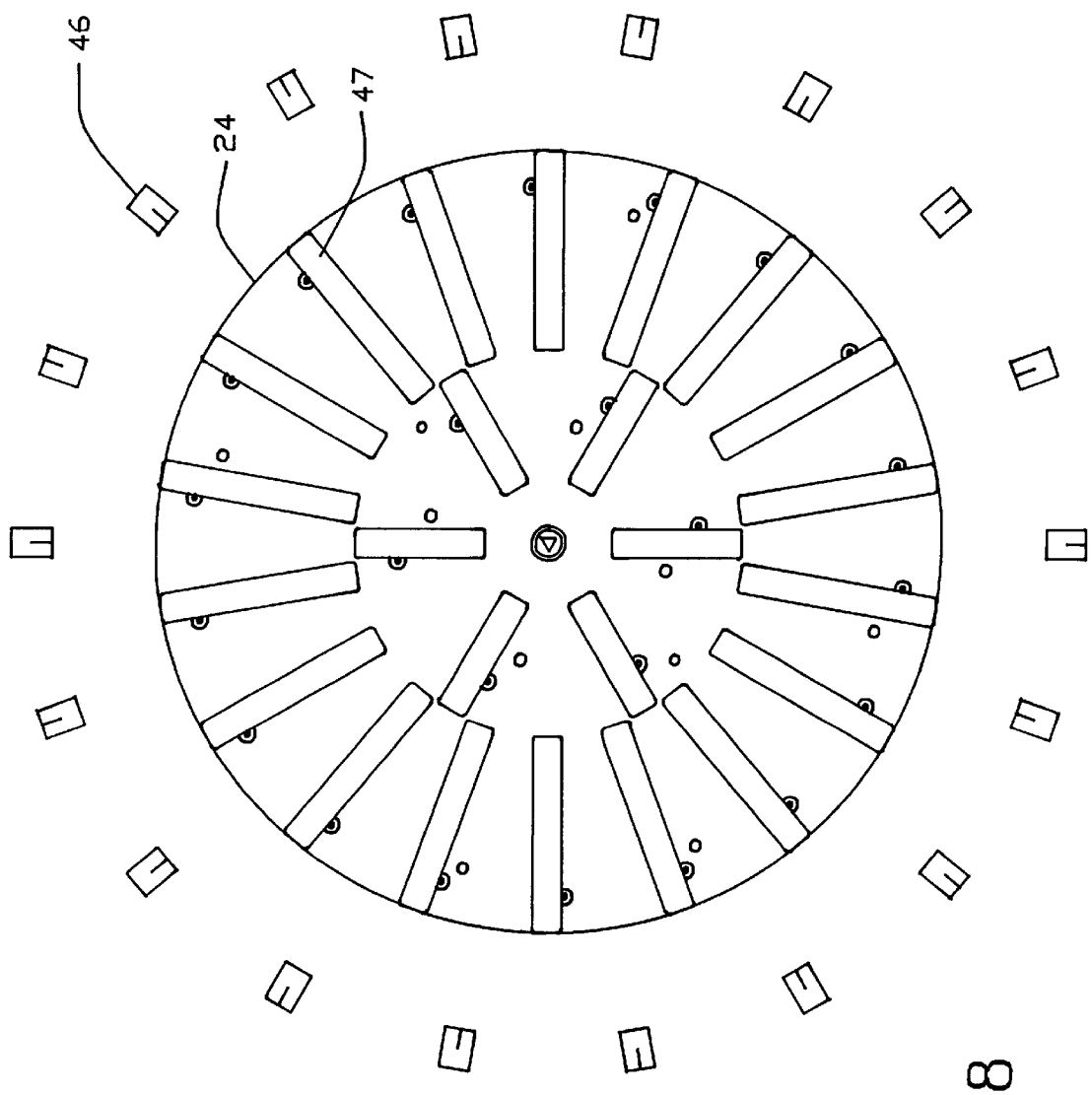

FIG. 8 depicts a perspective view of the arrangement of the magnets associated with the upper electrode of an embodiment of the invention shown in association with the magnets of FIG. 7.

DETAILED DESCRIPTION OF THE PREFERRED EMBODIMENT

Referring to the figures and in particular to FIG. 1, a side crosssectional view of an embodiment of the plasma etch reactor 20 of the invention is depicted. This reactor 20 enhances and improves upon the reactor depicted and described in U.S. Pat. No. 4,464,223, which patent is incorporated herein by reference.

Reactor 20 includes a reactor chamber 22 which is bounded by a grounded upward electrode 24, a side peripheral electrode 26, and a bottom electrode 28. The side peripheral electrode 26 is grounded or has a floating potential and in operation can be charged up by the plasma. In a preferred embodiment, the bottom electrode 28 is connected to a power supply 30 which provides power to the bottom electrode 26 preferably at 13.56 MHz (or multiples thereof) at a power level of preferably 900 watts and at a voltage of preferably 1,200 volts. The high frequency power supply can operate from 10 watts up to 2000 watts in a preferred embodiment. It is to be understood that this is a high frequency power supply (preferably in the radio frequency range) and that the frequency preferably can range from 2 MHz to 40 MHz and upwards to about 900 MHz. The power can also preferably be supplied in the range of 100 watts to 3,000 watts with a voltage of between 200 volts to 5,000 volts.

A second power supply 32 is additionally connected to the bottom electrode 28. The second power supply 32 is preferably operated at 450 KHz with the power being preferably supplied at 100 watts, and at a voltage of 300 volts. This is the low frequency power supply. It is to be understood that this power supply (preferably in the radio frequency range) can be operated in the range of about 100 KHz to about 950 KHz (preferably 1 MHz or less) with a power range of 10 watts to 2,000 watts, and a voltage range of 10 volts to 5,000 volts. Also connected to the bottom electrode 28 is a DC power supply 34. The high-frequency power supply controls ion flux, while low-frequency power supply independently controls ion energy.

It is the control of the power supplies and principally the high frequency power supply which advantageously controls the density of etch plasma in order to provide superior etch characteristics. Further, it is the design of reactor 20 which provides the enhanced plasma density range from which the optimal plasma density can be selected by the control of the power supply.

Associated with the grounded upward electrode 24 is a central nozzle 36 which directs a jet of process gas into the reactor chamber 22 directed at the semiconductor wafer 48. As will be discussed below in greater detail, the jets of process gas from the nozzle 36 are able to effectively reach the surface of the semiconductor wafer 48 and provide a fresh, uniform distribution of process gas over the entire surface of the semiconductor wafer 48.

Immediately above the grounded upper electrode 24 and the nozzle 36 is an exhaust stack 38, which is used to exhaust spent gas species from the reactor chamber 22. It is to be understood that a pump (not shown) is secured to the exhaust stack 38 in order to evacuate the gas species from the reactor chamber 22.

As can be seen in FIG. 1, immediately below the upper electrode 24 and nozzle 36 is a protruding, peripheral baffle 40. Baffle 40 is comprised of insulating material, and as will be discussed below, protrudes into the exhaust path 42 between the nozzle 36 and the housing 44 of the plasma etch reactor 20. Protruding baffle 40 ensures that there is a good mixture of the various gas species from the nozzle 36 and the solid source 50 in the reactor chamber 22.

Immediately below the protruding baffle 40 and in this embodiment incorporated into the side peripheral electrode 26 is a magnet or plurality of magnets 46. Also preferably incorporated in upper electrode 24 is a magnet or plurality of magnets 47. As will be discussed below, either one or both of these magnets 46 and 47 define a magnetic confinement chamber about and coincident with the reactor chamber 22. This magnetic confinement chamber ensure that the charged ion species in the reactor chamber do not leak therefrom, and that the charge ion species are concentrated about the semiconductor wafer 48. This magnetic confinement chamber inhibits the charged ion species from collecting on the walls of the reactor chamber 22.

Covering the side peripheral electrode 26 and the magnets 46 is a side peripheral solid source 50. Such a solid source is not required in the preferred embodiment as there is no power provided to the ring electrode 26. If, however, in addition to the above power source preferably, a high frequency power source were provided to the solid source 50, then this solid source 50 would provide for an innovative source of a gaseous species which can be sputtered through the bombardment of, for example, radio frequency excited ions which knock or erode atoms of the gas species from the solid source 50 into the reaction chamber 22. The erosion of gaseous species from the surface of the solid source can be affected by the pulsing of power supplies. As a further advantage, as portions of the surfaces of the solid source erode, no particles can be formed on the eroding surfaces by the combination of gaseous species. Thus, contamination from such particles formed on eroding portions of the solid surfaces are eliminated. Variations of the solid source 50 are discussed hereinbelow.

Immediately below the solid source 50 is the wafer chuck 52 which positions the semiconductor wafer 48 relative to the reactor chamber 22. Wafer clamp 53 holds the wafer 48 on the wafer chuck 52. In this embodiment, the wafer chuck 52 as well as the bottom electrode 28 can be moved vertically downward in order to insert and remove the wafer 48.

In this embodiment, if desired, the side peripheral electrode 26 and the magnets 46 can be cooled using a cooling water manifold 54. It is further to be understood that the solid source 50 can be heated if desired using a hot water manifold 56. Other methods of heating the solid source 50, and particularly the front exposed surface thereof, include resistive and inductive heating, and radiant heat provided by lamps and other sources of photons.

The protruding baffle 40 as well as the configuration of the magnets and the process gas jets from the nozzle, and the gas species eroded from the solid source (if a power supply is connected to the peripheral ring electrode 26), provide for a high density plasma adjacent to the surface of the semiconductor wafer. This configuration greatly increases the range of densities that can be achieved within the reactor chamber 22.

The above range of operation is not possible with prior devices. It is to be understood that one or more of the above features can be used to enlarge the plasma density range and thus improve the etch process and fall within the spirit and scope of the invention.

An alternative embodiment of the reactor 20 is shown in FIG. 2. Similar components are numbered with similar numbers as discussed hereinabove. In FIG. 2, the nozzle 36 has been modified in order to improve the uniformity of the mixture of the gaseous species in reactor chamber 22. As can be seen in FIG. 2, the nozzle 36 includes a manifold 70 which can channel the process gases in a number of directions. From manifold 70 there are horizontal ports 72, 74 which direct jets of the process gases horizontally and parallel to the upper electrode 24. Port 76 directs jets of the gas vertically downward directly onto the wafer 48. Ports 78 and 80 channel jets of the process gases in a direction skewed to the horizontal, and principally toward the periphery of the wafer 48 in order to assure a uniform distribution of process gases and/or a good mixture of the gas species. In this embodiment, it is also the combination of the ports of the manifold 70 and the protruding baffle 40 which ensures that a good mixture of (1) the gas species sputtered or eroded from the solid source 50 (if a source of power is connected to peripheral ring electrode 26), and (2) the process gases from the ports of the nozzle 36, are presented to the surface of the semiconductor wafer 48.

Etching in prior art devices is usually performed in the 300 to 500 millitorr range, which range is one to two orders of magnitude higher than the low pressures contemplated by the reactor of the present invention. For etching of submicron features required by state-of-the-art semiconductor devices, low pressure operations are desirable. However, at low pressures, it is more difficult to maintain a high density plasma.

For the embodiments of FIGS. 1 and 2, the present invention contemplates a magnetic field which contains the plasma at a low pressure (3–5 millitorrs), with a high plasma density ($10^{11} cm^3$ at the wafer), and with low ion energy (less than 15 to 300 electron volts). Generally, low pressure operation would be at about 150 millitorr or about 100 millitorr or less and preferably about 20 millitorr or about 10 millitorr or less. For submicron (sub 0.5 microns) devices, the plasma source must operate at a low pressure with a high density of activated gases at the wafer and a low ion energy in order to deliver superior etching results. A low pressure plasma improves the overall quality of the etch by minimizing the undercutting of the wafer features as well as the effect of microloading (etching concentrated features more rapidly than less concentrated features), both of which can adversely affect overall yield. Low pressure, however, requires a high density plasma at the wafer to increase the number of plasma particles reacting with a film on the semiconductor wafer being etched in order to maintain a fast etch rate. A fast etch rate is one factor leading to a higher average throughput. Further, low ion energy leads to improved etch selectivity and minimizes wafer damage. Both of which improve overall yield. It is contemplated that the present embodiment can operate at about 150 millitorr or less.

The reactor 20 of the present invention can be used to etch a variety of different substrates or films which require different etch chemistry or recipe. Principally, the embodiments of the invention are used to etch the new emerging films. Generally, this chemistry includes two or more of the following gases: halogen gases, halogen containing gases, noble gases, and diatomic gases.

Variations of the above features describe above will now be explained in greater detail.

Solid Source

Again, it is to be remembered that the solid source only comes into operation if a power supply is connected to the peripheral ring electrode 26. However, if a power supply, preferably a high frequency power supply such as power supply 30, is connected to peripheral electrode 26 in an alternative embodiment, then the following applies.

It has been determined that the gaseous species eroded or sputtered from the solid source 50 or the lack of species eroded or sputtered therefrom can have a profound effect on the success of the etching process carried out in the plasma etch reactor 20. By way of example only, the solid source 50 can be comprised of a dielectric material such as for example silicon dioxide ($SiO_2$) or quartz which upon bombardment by radio frequency excited ions provide gaseous ions of silicon and oxygen from the solid source into the reaction chamber. Another type of dielectric solid source can include a ceramic such as alumina ($AL_2O_3$). This ceramic has a low sputtering or erosion rate when impacted by excited gaseous ions and is useful for situations where no additional contribution from a solid source is required or desired. Particularly, with respect to alumina, with a power supply under approximately 600 volts peak to peak, little or no sputtering is observed. Over that threshold, there is sputtering from an alumina solid source.

Generally, the solid source can be comprised of a semiconductor material, a dielectric material, or a conductor. In fact, the solid source could be embodied in the materials which comprise the electrode, and those materials can be eroded to provide appropriate gas species for the plasma in the reactor chamber. Appropriate dielectric materials also include silicon nitride ($Si_3N_4$), in addition to other metal oxides besides alumina ($Al_2O_3$). Semiconductor materials can include silicon carbide (SiC).

The surface temperature of the solid source 50 is preferably above 80° C. in order to provide for adequate sputtering. At this temperature and with the appropriate energized ions eroding the surface of these solid source, the solid source does not become a cold sink for the formation of particles, as discussed herein, from gaseous species, which particles can break away and contaminate the reaction chamber 22.

As discussed above, the rate of erosion or sputtering of the gaseous species from the solid source 50 can be controlled by plurality the high frequency power supply (not shown but similar to supply 30). By increasing the power supply (not shown but similar to supply 30), higher energy ions can be used to bombard the solid source 50 in order to increase the rate of erosion of gaseous species from the solid source for purposes of the etching process. By way of example, should a solid source of silicon dioxide be used, increased bombardment would enhance anisotropic etching as the gaseous species sputter from the silicon dioxide would passivate vertical surfaces on the semiconductor wafer so that such surface would not be undercut by the gaseous etchant species.

Gaseous Source

In addition to the above benefits described with respect to the gaseous species eroded from the solid source, such benefits can also be acquired by introducing in the process gases, gases which have the effect derived from the gaseous species eroded from the surface of the solid source. By way of example only, a gaseous form of tetraethoxysilane (TEOS) can be introduced with the process gas. TEOS is a source of silicon and oxygen for the etching process. TEOS in the process chamber provides the same gaseous species as does a solid source of silicon dioxide ($SiO_2$) with the advantages to the etching process described herein. Also it is to be noted that a combination of both solid source and a gaseous source of such species would be within the spirit and scope of the invention.

Nozzles

FIGS. 3a, 3b, 4a, 4b, 4c, 4d, 5a, 5b, 5c, 6a, 6b, and 6c depict alternative preferred embodiments of nozzle arrangements which can be used with the above invention. Conventional nozzle arrangements are generally configured in a "shower head" configuration with as many as 200 ports from which process gases to be ejected. The intent of such an arrangement was to ensure that there was a uniform distribution of the process gases in the chamber, and in particular, at the surface of the semiconductor wafer that was being processed. Prior art devices have been found to create a layer of stagnate, used gases which have already reacted with the wafer surface and thus dilute the uniformity of new process gases directed toward the surface. The present invention improves upon such prior art nozzles. The present invention includes nozzles which generate discrete collimated jets of process gases which merged together adjacent the wafer surface to create a uniform distribution at the surface of the wafer. The velocity of the gases and the volume in the jets assure that fresh process gas reaches the surface of the semiconductor wafer. Thus, fresh process gases are uniformally distributed at the surface of the semiconductor wafer. These process gas jets stir up the gases at the surface of the wafer making a uniform distribution of process gas and gaseous species eroded from the surface of the solid source.

Figure 3A:
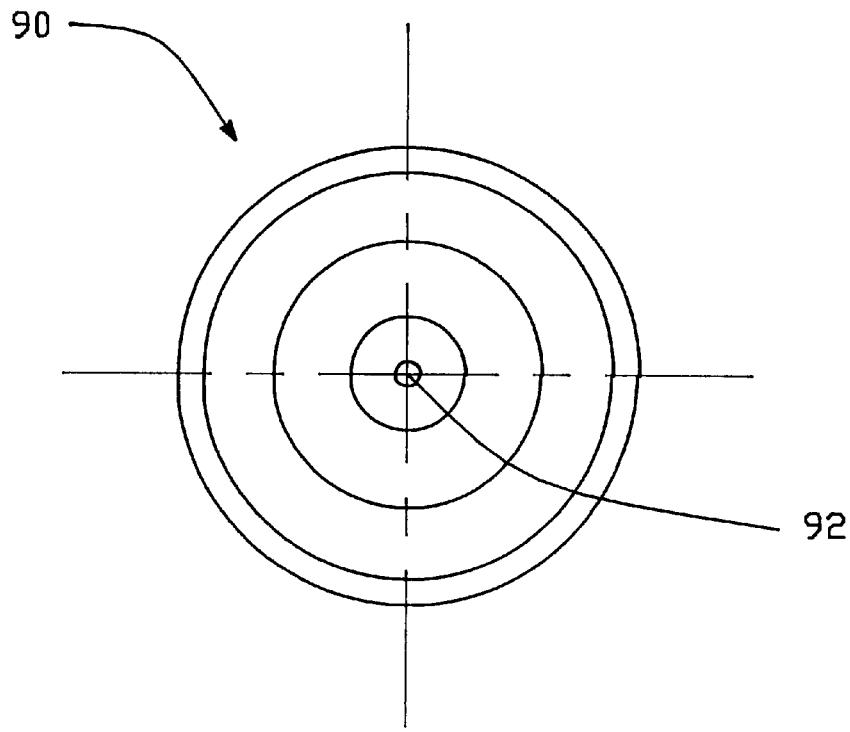
FIGS. 3a and 3b depict end and side cross-sectional views of a preferred embodiment of a nozzle of the invention.
Figure 3B:
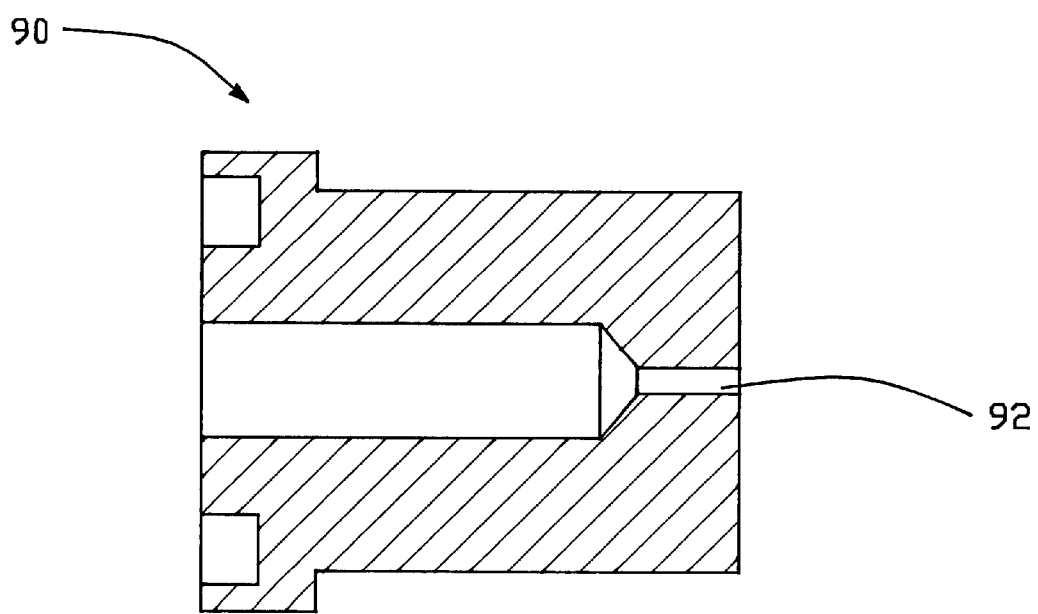

FIGS. 3a and 3b depict a one-port nozzle 90 with the port identified as 92. The nozzle is preferably comprised of alumina. With this arrangement, a single jet of gas is projected toward the semiconductor wafer.

FIGS. 4a, 4b, 4c, and 4d depict another preferred embodiment of a nozzle 94 of the invention which is also comprised of alumina. In this embodiment, the nozzle 94 includes twelve ports which define jets of process gas that are directed toward the semiconductor wafer. Preferably, the jets are directed at an angle which is skew to vertical and the centerline of each jet is directed toward the peripheral edge of the wafer. This arrangement is again beneficial in ensuring that there is a uniform distribution of new process gases at the surface of the wafer. As can be seen in FIG. 4d, the ports are distributed around the periphery of the face of the nozzle.

FIGS. 5a, 5b, and 5c depict a further embodiment of a nozzle 98 of the invention. In this arrangement, the ports 99 are depicted in a star formation with some of the ports being provided on the periphery of the face (FIG. 5c) of the nozzle 98 while other of the ports are centrally located with one port on the centerline of the nozzle. As with the gases from the nozzle of FIG. 4a, the jets of the nozzle of FIG. 5a are angled with respect to the vertical and thus are directed both at the body of the semiconductor wafer and at the edge of the semiconductor wafer in order to provide a uniform distribution of process gas.

FIGS. 6a, 6b, and 6c depict yet another preferred embodiment of the nozzle 100 of the invention. In this embodiment, ports 102 are directed essentially normal to a vertical line between the nozzle and the semiconductor wafer. In this embodiment, the nozzles are directed toward the solid source on the side wall in order to ensure greater mixing of the gas species from the solid source and the process gas.

Emerging Films

It is noted that the above reactors are particularly useful in etching a new class of emerging films used in new chip designs. By way of example only, these reactor configurations are useful in the etching of platinum (Pt), currently being used in the development of high density DRAM devices. Further, these reactors are useful in etching of lead zirconium titanate (PZT), currently being used in the development of non-volatile, ferro-electric random access memory (FRAM) devices. Additionally, this reactor is useful in the etching of Iridium (Ir). Yet, another emerging film which can be successfully etched using this apparatus and method is comprised of bismuth strontium tantalate (Y-1). While these new films contribute to improved, circuit performance, their unique properties make them particularly difficult to etch, and therefore, require the more advanced etch process techniques of the present invention. Other emerging films that can be processed with the preferred embodiment include barium strontium titanate (BST), iridium oxide ($IrO_2$), ruthenium (Ru), and ruthenium oxide ($RuO_4$).

It is to be understood that these new emerging films have significant advantages in the latest semiconductor devices. By way of example, dielectrics used in older semiconductor devices have a dielectric constant of between 2 and 4. With PZT the dielectric constant is 1400. Thus, the new memory devices made with such films can be significantly smaller (with smaller features) and have more memory capability. Further, such films can be used to fashion capacitors for DRAMs and non-volatile memories which can thus replace devices such as EPROMs, SRAMs, etc.

It has been observed that the dual frequencies on the bottom electrode 28 are beneficial in the successful etching of the emerging films for the latest semiconductor products. This arrangement allows for etching device features which appropriate anisotropic side wall profiles in order to accommodate the reduced critical dimensions, which are in the submicron range of about 0.25 microns and less.

Magnetic Confinement

The above identified magnets 46, 47 provide a magnetic confinement around reactor chamber 22 which ensures that a high density plasma can be formed at low pressure. It is to be remembered that the plasma is created through a collision of gas atoms and electrons, generating ions to create a high density plasma at low pressure. The present invention achieves this by increasing the total path length of the electrons traveling through the plasma while minimizing ion loss to the reactor wall. The electrons traveling toward the plasma are reflected by the magnetic field back into the plasma thus increasing the path length of the electrons.

With the present invention, the magnets can either be electromagnets or permanent magnets and be within the spirit and scope of the invention. These magnets, surrounding the etched chamber, create a static magnetic field container. The magnetic field effect exists only near the reactor walls, is virtually non-existent at the wafer, creating an inherently uniform plasma. The magnets provide the function of protecting the electrodes as with a stronger magnetic confinement, there is less erosion on the electrodes. A weaker confinement provides for more erosion of the electrode and the solid source.

The magnetic confinement caused by the magnets 46, 47, thus is designed to concentrate the plasma and can have the effect of protecting the process chamber parts, including the electrodes from the corrosive plasma. As a result, there are considerable cost savings, as the cost for replacing the electrodes is reduced.

FIGS. 7 and 8 depict an arrangement of the magnet 46, 47, in association with the side electrode 26 and the upper electrode 24 respectively. As can be seen in FIG. 7 there are a plurality of slots 60 found relative to the electrode 26. In a preferred embodiment, every other of the slots 60 are filled with the magnet 46. These magnets located behind the solid source 50 affect the rate of erosion of gas species from the solid source. As indicated above, without the magnets, it is possible that too many gaseous species can be eroded from the solid surface and thus affect the etch process.

It is to be noted that these magnets are pole face magnets. The north and south poles are on the faces 62 and the opposing faces 64 of the magnets. The magnets are arranged alternatively so that first a north pole face of one magnet 46 and then a south pole face of a second magnet 46 are directed toward the center of the chamber. This is repeated about the outer periphery of the electrode 26.

FIG. 8 depicts the arrangement of the magnets 47 associated with the upper electrode 24. Again, these magnets are pole faced magnets, with the north and south poles projecting from the side faces of the magnets. For the configuration of FIG. 8, the magnets alternate with the north and then the south poles facing towards the chamber.

For this embodiment, the magnetic confinement chamber of the present invention preferably uses powerful rare earth magnets in order to provide an optimal confinement for the plasma in the reactor chamber.

Rare earth magnets minimize the effect of electrons and gaseous ions leaking from the reactor chamber 22. This aids in increasing the density of the plasma and thus the efficiency of the etching process. In a preferred embodiment, the rare earth magnets are comprised of samarium cobalt. Preferably, these magnets have a magnetic strength at the surface of between 2,000 GAUSS and 2,200 GAUSS. Generally, however, these rare earth magnets can have a strength at the surface of between 1,500 and 2,500 Gauss.

In a particular embodiment, the peripheral electrode 26 retains such eighteen (FIGS. 7, 8) rare earth magnets placed side by side on the periphery of the reactor 20. The grounded upper electrode 24 has associate therewith twenty-four (FIG. 8) such rare earth magnets in a preferred embodiment. These magnets are arranged to provide a symmetric magnetic field in the reactor chamber 22. With respect to the rare earth magnets 47 associated with the grounded upper electrode 24, these magnets are provided in a spoke arrangement around a central point. The arrangement is comprised of magnets which extend from the central point toward the periphery and magnets which extend from the periphery to a position short of the central point. As indicated above, such rare earth magnets give maximum repulsion of charged particles and electrons at the walls of the reactor chamber 22. With such a configuration, there is not much sputtering or erosion of gaseous species from the solid source (especially when the peripheral electrode 26 is grounded or floating) and thus, silicon dioxide ($SiO_2$) can be used as the solid source rather than the more expensive alumina ($AL_2O_3$).

Reactor Chamber

The reactor chamber in the present invention has been specifically designed, as discussed above and below, in order to enhance the uniformity of the plasma. With respect to the physical characteristics of the reactor chamber 22, as noted above, both the placement of the baffle 40 and the nozzle 36, 70 contribute to the uniformity of the process gases in the reactor chamber 22. The baffle 40 ensures that the gas species eroded from the surface of the solid source 50 (particularly if a power supply is connected to the peripheral electrode 26) are not immediately drawn up by the pump through the exhaust shaft 38, but are allowed to mix with the gases in the reactor chamber adjacent to the semiconductor wafer 48. Additionally, the nozzle 38 having ports which channel jets of gases vertically, horizontally, and at skewed angles ensure that any gas species from the solid source are thoroughly mixed with the process gases from the nozzle and that this uniform mixture is provided to the semiconductor wafer 48.

The height of the reactor chamber from the nozzle to the surface of the semiconductor wafer can be optimized. Prior art devices have a height of 5¼". It has been found that with the above described height and also the nozzle arrangements can be optimized in order to have the gas jets from the nozzle provide a uniform distribution of process gas at the surface of the semiconductor wafer. Thus, also for varying reactor heights, nozzle pattern compared to chamber pressure can be optimized for the etch process including the etch process using a solid source. This height is irrespective of the diameter of the reactor chamber, although in a preferred embodiment, the reactor chamber is approximately 14½" in diameter. By way of example only, for preferred operation at two to three millitorr of pressure in the reactor chamber 22, the height of the reactor chamber would be preferably about 4". For a height of less than 4", the jets would still be collimated and thus not uniformly spread at the surface of the wafer. For a height greater than 4", the jets could merge together above the surface of the semiconductor wafer so as not to provide a uniform distribution of process gases at the surface of the wafer.

Optimally, for a given nozzle configuration, it has been found that the product of the height of the reactor chamber 22 with the pressure in the chamber, should be constant in order to provide for optimal performance. Thus, as indicated above, optimal performance can be achieved with a height of 4" and a pressure of two to three millitorr.

The range of values for pressure and height include a height range of 1/10 of an inch corresponding to 100 millitorr to a height of 10" corresponding to one millitorr for optimal performance. That is to say that as the pressure increases in the reactor chamber, that the height of the reactor chamber can be less and that as the pressure decreases, the height would increase in order to provide for optimal mixing of (1) the gases eroded from the solid source, (2) injected process gases, and (3) reaction products from the wafer surface.

The effect of the above invention is to (1) increase the selectivity (i.e., for example protect the oxide substrate), (2) enhance the profile control of the etch process, and (3) enhance the line width control (i.e., protecting the photoresist from the etching process so that the correct line width is transferred from the photoresist to the wafer).

INDUSTRIAL APPLICABILITY

From the above, it can be seen that the present invention afford an apparatus and method which can successfully etch emerging films used to fabricate high density semiconductor devices such as high density semiconductor memories.

Other features, aspects and objects of the invention can be obtained from a review of the figures and the claims.

It is to be understood that other embodiments of the invention can be developed and fall within the spirit and scope of the invention and claims.

We claim:

1. A plasma etch reactor comprising:
   a reactor chamber;
   a first electrode;
   a second electrode;
   a first power source connected to said second electrode which generates power at a first frequency;
   a second power source connected to said second electrode which generates power at a second frequency;
   said second electrode is associated with a chuck which is adapted for holding a wafer to be processed;
   said first power source generates power at a low frequency;
   said second power source generates power at a high frequency; and a third electrode connected to a third power source which generates power at a low frequency.

2. The reactor of claim 1 including:

a plasma confinement device that is adapted to contain a plasma in the reactor.

3. The reactor of claim 2 including:

said reactor chamber including an upper wall, a lower wall, and a peripheral side wall which is located in between the upper wall and the lower wall;

said second electrode located adjacent to said lower wall and said confinement device located adjacent to said peripheral side wall.

4. The reactor of claim 3 including:

said confinement device located additionally adjacent to said top wall.

5. The reactor of claim 3 wherein:

said confinement device includes a plurality of magnets which are substantial parallel and are located about said peripheral side wall.

6. The reactor of claim 3 wherein:

said confinement device includes a plurality of magnets; and said magnets are rare earth magnets.

7. The reactor of claim 3 wherein:

said confinement device includes a plurality of magnets;

said reactor chamber has a center; and said magnets are pole face magnets with north pole and south pole faces, and said magnets are arranged alternately so that first a north pole face of one magnet and then a south pole face of a second magnet are directed toward the center of the reactor chamber.

8. The reactor of claim 3 wherein:

said confinement device includes a plurality of magnets associated with said peripheral side wall;

said first electrode is associated with said upper wall; and said confinement device includes another plurality of magnets that are associated with said first electrode.

9. The reactor of claim 8 wherein:

said upper wall has a center; and said another plurality of magnets associated with said upper wall are positioned along radii extending outwardly from the center of said upper wall.

10. The plasma etch reactor of claim 2 including:

a magnetic confinement associated with said reactor chamber.

11. The plasma etch reactor of claim 10 wherein:

said magnetic confinement is comprised of rare earth magnets.

12. The plasma etch reactor of claim 11 wherein:

said rare earth magnets are samarium cobalt magnets.

13. The plasma etch reactor of claim 2 including:

said confinement device having one or more magnets positioned about the reactor chamber; and each said magnet having a strength of about 1,500 Gauss to about 2,500 Gauss at the surface.

14. The plasma etch reactor of claim 13 wherein:

a magnetic field established by said rare earth magnets is symmetrical.

15. The plasma etch reactor of claim 1 wherein:

said reactor is capable of etching high conductivity materials.

16. The plasma etch reactor of claim 1 wherein:

said reactor is capable of etching high conductivity materials to submicron dimensions.

17. The plasma etch reactor of claim 1 wherein:

said reactor is capable of etching films of at least one of lead zirconium titanate (PZT), platinum (Pt), iridium (Ir), bismuth strontium tantalate (Y-1), barium strontium titanate (BST), iridium oxide ($IrO_2$), ruthenium (Ru), and ruthenium oxide ($RuO_4$) to submicron dimensions.

18. The plasma etch reactor of claim 1 wherein:

said reactor is capable of etching wafers for ferro-electric random access memories (FRAMs).

19. The plasma etch reactor of claim 1 wherein:

said first power source generates power at a high frequency of about 2 MHz to about 950 MHz; and said second power source generates power at a low frequency of about 10 KHz to about 1 MHz.

20. The plasma etch reactor of claim 1 wherein:

said first power source generates about 10 watts up to about 2,000 watts; and said second power source generates about 100 watts up to about 3000 watts.

21. The plasma etch reactor of claim 1 wherein:

said reactor chamber is capable of operating at about 150 millitorr or less and preferably 50 millitorr or less.

22. The reactor of claim 1 wherein:

said first electrode is one of electrically floating or at ground.

23. The plasma etch reactor of claim 1 wherein:

said first power source generates power at about 1 MHz or less; and said second power source generates power at about 2 MHz or greater.

24. The plasma etch reactor of claim 1 wherein:

said second power source generates power at about 13.56 MHz; and said first power source generates power at about 450 KHz.

25. An enhanced plasma etch reactor comprising:

a reactor chamber;

a first electrode;

a second electrode spaced from said first electrode;

a first power source connected to said second electrode which generates power at a first frequency;

a second power source connected to said second electrode which generates power at a second frequency;

a plasma confinement device that is adapted to contain a plasma in the reactor;

said second electrode is associated with a chuck which is adapted for holding a wafer to be processed; and a solid source of at least one gaseous species.

26. The reactor of claim 25 including:

a third power source connected to said first electrode.

27. The reactor of claim 26 wherein:

said first, second, and third power sources are AC power source sources; and a DC power source connected to said second electrode.

28. The reactor of claim 27 wherein:

said first, second, and third power sources are AC power source sources; and a DC power source connected to said second electrode.

29. The reactor of claim 26 including:

a third power supply connected to said first electrode.

30. The reactor of claim 29 wherein:

said first, second, and third power sources are AC power source sources; and a DC power source connected to said second electrode.

31. An enhanced plasma etch reactor comprising:

a reactor chamber;

a first electrode;

a second electrode spaced from said first electrode;

a first power source connected to said second electrode which generates power at a first frequency;

a second power source connected to said second electrode which generates power at a second frequency;

a plasma confinement device that is adapted to contain a plasma in the reactor;

said second electrode is associated with a chuck which is adapted for holding a wafer to be processed; and a solid source of at least one gaseous species covering said first electrode.

32. The reactor of claim 31 including:

a third power source connected to said first electrode.

33. The reactor of claim 32 wherein:

said first, second, and third power sources are AC power source sources; and a DC power source connected to said second electrode.

34. An enhanced plasma etch reactor comprising:

a reactor chamber;

a first electrode;

a second electrode;

a first AC Dower source connected to said second electrode which generates power at a first frequency;

a second AC power source connected to said second electrode which generates power at a second frequency; and a third DC power source connected to said second electrode.

35. The plasma etch reactor of claim 34 wherein:

said first power source generates power at about 1 MHz or less; and said second power source generates power at about 2 MHz or greater.

36. The plasma etch reactor of claim 34 wherein:

said second power source generates power at about 13.56 MHz; and said first power source generates power at about 450 KHz.

37. The plasma etch reactor of claim 34 including:

a magnetic confinement associated with said reactor chamber.

38. The reactor of claim 34 including:

a solid source of at least one gaseous species.

39. A plasma etch reactor comprising:

a reactor chamber:

a first electrode;

a second electrode;

said first electrode is one of electrically floating or at ground;

a first power source connected to said second electrode which generates power at a low frequency;

a second power source connected to said second electrode which generates power at a high frequency;

a plasma confinement device that is adapted to contain a plasma in the reactor;

said second electrode is associated with a chuck which is adapted for holding a wafer to be processed;

a third electrode connected to a third Dower source which generates power at a low frequency;

said first power source, said second power source, and said third power source being AC power sources; and a fourth power source connected to said second electrode, said fourth power source being a DC power source.

40. The plasma etch reactor of claim 39 wherein:

said first power source generates power at about 1 MHz or less; and said second power source generates power at about 2 MHz or greater.

41. The plasma etch reactor of claim 39 wherein:

said second power source generates power at about 13.56 MHz; and said first power source generates power at about 450 KHz.

42. An enhanced plasma etch reactor comprising:

a reactor chamber;

a first electrode;

a second electrode spaced from said first electrode;

a first power source connected to said second electrode which generates power at a first frequency;

a second power source connected to said second electrode which generates power at a second frequency;

said second electrode is associated with a chuck which is adapted for holding a wafer to be processed; and a solid source of at least one gaseous species.

43. The reactor of claim 42:

including a plasma confinement device that is adapted to contain a plasma in the reactor.

44. An enhanced plasma etch reactor comprising:

a reactor chamber;

a first electrode;

a second electrode spaced from said first electrode;

a first power source connected to said second electrode which generates power at a first frequency;

a second power source connected to said second electrode which generates power at a second frequency;

said second electrode is associated with a chuck which is adapted for holding a wafer to be processed; and a solid source of at least one gaseous species covering said first electrode.

45. The reactor of claim 44:

including a plasma confinement device that is adapted to contain a plasma in the reactor.

46. The reactor of claim 44 including;

a third power source connected to said first electrode.

47. An enhanced plasma etch reactor comprising:

a reactor chamber;

a first electrode;

a second electrode spaced from said first electrode;

a first power source connected to said second electrode which generates power at a first frequency;

a second power source connected to said second electrode which generates power at a second frequency;

said second electrode is associated with a chuck which is adapted for holding a wafer to be processed;

said reactor chamber including an upper wall, a lower wall, and a peripheral side wall which is located in between the upper wall and the lower wall;

said second electrode located adjacent to said lower wall;

a third electrode located adjacent to said peripheral side wall;

said first power source generates power at a low frequency;

said second power source generates power at a high frequency; and a third power source connected to said third electrode located adjacent to said peripheral wall, said third power source generates power at a low frequency.

48. The reactor of claim 47:

including a plasma confinement device that is adapted to contain a plasma in the reactor.

* * * * *

UNITED STATES PATENT AND TRADEMARK OFFICE
CERTIFICATE OF CORRECTION

PATENT NO. : 6,190,496 B1            Page 1 of 1
DATED : February 20, 2001
INVENTOR(S) : Stephen P. DeOrnellas; Alferd Cofer; Robert C. Vail It is certified that error appears in the above-identified patent and that said Letters Patent is hereby corrected as shown below:

<u>Column 13, claim 34,</u>
Line 32, delete "Dower" and insert -- power -- therefor.

<u>Column 14, claim 39,</u>
Line 3, delete "Dower" and insert -- power -- therefor.

Signed and Sealed this

Eighteenth Day of December, 2001

Attest:

Attesting Officer

JAMES E. ROGAN
Director of the United States Patent and Trademark Office